INVENTOR:
Robert H. Russell
By Smyth, Roston & Pavitt
ATTORNEYS

INVENTOR:
Robert H. Russell
By Smyth, Roston & Pavitt
ATTORNEYS

INVENTOR:
Robert H. Russell
By Smyth, Roston & Pavitt
ATTORNEYS

United States Patent Office 3,513,400
Patented May 19, 1970

3,513,400

ANALOG TO PULSE WIDTH CONVERSION SYSTEM INCLUDING AMPLITUDE COMPARATORS

Robert H. Russell, Altadena, Calif., assignor, by mesne assignments, to Whittaker Corporation, Los Angeles, Calif.

Filed Nov. 25, 1966, Ser. No. 597,040
Int. Cl. H03k 5/20, 9/02
U.S. Cl. 328—147 9 Claims

ABSTRACT OF THE DISCLOSURE

An analog to pulse width conversion system wherein the width of the pulses in the pulse signal is in accordance with the amplitude of an analog signal. The present invention uses a constant current source to pass the constant current through a variable impedance transducer so as to produce the analog signal. The present invention also uses a pair of amplitude comparators for comparing the analog signal and a ramp signal so as to produce output signals in accordance with the comparison and wherein the width of the pulses in the pulse signal is in accordance with the time difference between the output signals from the pair of comparators.

This invention relates to an analog to pulse width converter. Specifically, the invention relates to the conversion of an analog signal to a pulse signal wherein the width of the pulses in the pulse signal is in accordance with the amplitude of the analog signal. The invention also relates to analog to pulse width conversion circuits that are simpler and more reliable than prior art conversion circuits. For example, the system of the present invention provides for an analog to pulse width conversion circuit which uses components which need not be as critical as the components used in prior art circuits.

The converter system of the present invention not only provides for a reliable conversion from an analog signal to a pulse width signal, but, in addition, the pulse width of the pulse signal produced by the conversion circuit of the present invention is a true measure of the amplitude of the analog signal. For example, the present invention allows for the use of a single reference energy source to control both the production of the analog signal and the conversion of the analog signal to a pulse width signal. The output pulse signal is dependent upon a ratio of quantities and any changes which may occur in the total system due to temperature or other environmental conditions are not reflected into the output pulse signal since the ratio remains constant. The output signal from the pulse width conversion system, therefore, is always proportional to the amplitude of the input signal, no matter what environmental changes may occur in the system. In the system of the present invention the output pulse width is not dependent upon several parameters as with prior art systems, but the output pulse width is essentially independent of everything except the amplitude of the input signal.

The present invention is also directed to a system for producing a serial output pulse signal from a plurality of parallel analog signals. First the analog signals are individually partially converted to intermediate signals and the intermediate signals are then used sequentially to produce the serial output pulse signal having pulse widths in accordance with the amplitudes of the analog signals. The system for producing the serial output pulse signal uses the pulse width converter of the present invention and has the advantages of this pulse width converter. In addition, the system for producing the serial output pulse signal is simple in construction, reliable in operation, and provides for a very low current drain.

The analog to pulse width converter of the present invention is much simpler and more reliable than the prior art systems. For example, one prior art method of converting an analog signal to a pulse width signal has been to produce a pulse train of constant repetition rate but having a variable pulse width. This pulse train of constant repetition rate is then integrated and compared to the analog signal. Error detecting circuitry is used to adjust the pulse width of the pulses in the pulse train to eliminate the error and thereby produce the desired pulse width. The disadvantage of this afore-described type of pulse width converting system and other prior art pulse width converting systems is that many portions of the circuitry of the prior art systems are critical in their values. Therefore, the output pulse width is dependent upon these critical components which may vary in accordance with environmental conditions rather than having the pulse width independent of everything but the amplitude of the analog signal.

The present invention eliminates the critical nature of the prior art systems by using a pulse width converting circuit which includes a pair of voltage comparators and a ramp generator. The ramp generator includes a constant current source driving a capacitor to produce a decreasing ramp voltage. The ramp voltage is applied to first inputs of the voltage comparators and the analog signal and a reference signal are applied to second inputs of the voltage comparators.

As the ramp voltage decreases the first one of the comparators produces an output pulse signal when the ramp voltage is equal to the analog voltage. The second voltage comparator produces an output pulse signal when the ramp voltage is equal to the reference voltage. The two output pulse signals from the voltage comparators therefore have a time relationship in accordance with the amplitude of the analog signal since the reference signal has a constant value, the ramp signal has a constant slope and the analog signal is the only variable.

The output pulse signals from the voltage comparators may be applied either directly to an exclusive OR circuit or may be applied through capacitors to a flip-flop. When the output pulse signals are applied directly to the exclusive OR circuit, the exclusive OR circuit produces an output signal having a pulse width in accordance with the amplitude of the analog signal directly from the output pulse signals from the voltage comparators. The output pulse signals from the voltage comparators may also be applied through capacitors, acting as high pass filters, to a flip-flop as indicated above and the signals from the capacitors are therefore trigger signals to control the state of the flip-flop. The trigger signals control the flip-flop to produce an output signal from the flip-flop having a pulse width in accordance with the amplitude of the analog signal.

The use of the exclusive OR circuit is simpler than the use of the flip-flop, but the use of the exclusive OR circuit produces a pulse width output signal which has a rise time in accordance with the rise time of the signals from the voltage comparators. The use of the flip-flop produces a pulse signal which has a rise time independent of the rise time of the signals from the voltage comparators. It is desirable to use the exclusive OR circuit when the rise time of the pulse width output circuit is not important and to use the flip-flop when the rise time of the pulse width output signal is important.

The circuit described above for providing conversion from an analog to a pulse width signal has certain advantages over the prior art. The system of the present invention is generally quite simple and reliable. In addition, the system of the present invention allows for the use of the exclusive OR circuit which is a simpler output circuit than is usually used with prior art pulse width converters.

The above described pulse width conversion system is also advantageous in that it allows for the use of a single reference source of energy to drive both the pulse width converter and the analog signal. For example, one common method of deriving an analog signal is to use a transducer as part of a bridge circuit and wherein the transducer has a variable impedance in accordance with some physical phenomenon. For example, the transducer may measure temperature, pressure, etc. The bridge circuit is driven by a first constant current generator so that a variable analog signal is produced from the bridge circuit in accordance with the impedance change in the transducer. The errors in the analog output may be produced by changes in the first constant current and in turn the first constant current is directly affected by changes in the reference source of energy.

The pulse width converter of the present invention is also driven by a second constant current generator since the ramp voltage is produced from the second constant current generator. Errors in the pulse width conversion may therefore result from changes in the second constant current which is in turn affected by changes in the reference source of energy. It is, therefore, possible to control both constant current generators from a single reference source of energy, such as a reference voltage source. The ratio of the constant currents would, therefore, remain constant, with changes in the reference voltage source, even though temperature and other environmental conditions may affect the value of the reference voltage. Also environmental conditions would affect the constant generators equally so that the ratio of the currents would remain constant.

Since the analog voltage is a direct function of the first constant current and the analog voltage is then compared to a ramp voltage which is directly proportional to the second constant current and when the ratio between the constant currents is held constant, then the output pulse width signal is a true measure of the amplitude of the analog signal. The relationship between the analog signal and the pulse width signal will remain even though the constant currents may change, as long as the constant currents are maintained in a constant ratio. Since it is much easier to maintain a constant ratio between two currents than to maintain a single current constant, the present invention provides for an output pulse signal having a pulse width which is a very accurate indication of the amplitude of an input analog signal. The accuracy of conversion is obtained with a relatively simple circuit that is easy to construct and wherein the accuracy is part of the design of the circuit rather than through the use of critical values for components.

The particular type of analog to pulse width conversion described above may also be used to provide for a serial pulse width output signal from a plurality of parallel analog input signals. The analog input signals are all passed through pulse width converter circuits which include the pair of voltage comparators and ramp generator. All of the output signals from the voltage comparators are then fed to a single exclusive OR circuit or flip-flop so as to produce the serial pulse width output signal. The actual switching between each analog signal is provided by a counter and the counter also controls which of the converter circuits applies its output signals to the flip-flop or exclusive OR circuit.

The present invention, therefore, provides for analog to pulse width converting, either from a single analog signal or from a plurality of parallel analog signals and provides for this conversion with a relatively simple and reliable converting system. A clearer understanding of the present invention will be had with reference to the following description and the drawings, wherein:

FIG. 1 illustrates an analog to pulse width converter using a flip-flop to provide the pulse width output signal;

FIG. 1*a* is a series of curves illustrating the operation of FIG. 1;

FIG. 2 is an analog to pulse width converter using an exclusive OR circuit to provide the pulse width output signal;

FIG. 2*a* is a series of curves illustrating the operation of FIG. 2;

Figure 1:
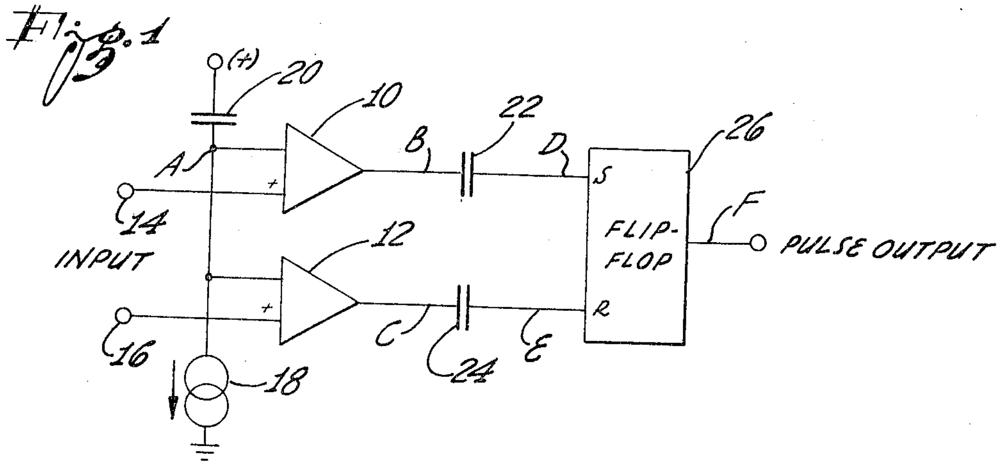

In FIG. 1, a pair of voltage comparators 10 and 12 each have a pair of input terminals. An analog input signal is applied to terminal 14 and a reference voltage is applied to terminal 16, and terminal 14 is interconnected with a first input terminal of voltage comparator 10 and terminal 16 is interconnected with a first input terminal of voltage comparator 12. A source of constant current 18 is connected between a capacitor 20 and a reference potential such as ground. The capacitor 20 is also connected to a source of fixed voltage. In addition, the voltage comparators 10 and 12 have the second one of their input terminals connected to the junction between the capacitor 20 and the constant current source 18.

Figure 1A:
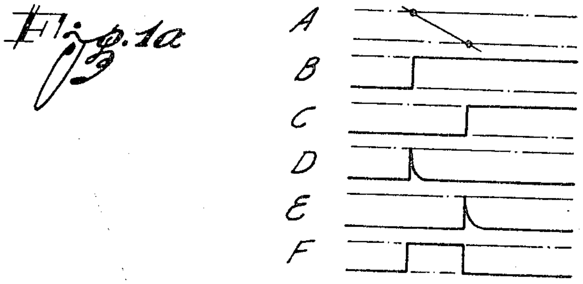

The capacitor 20 is initially charged by the positive voltage and when the constant current source 18 begins to flow, the capacitor 20 is discharged at a steady rate to the reference potential such as ground. This may be seen in FIG. 1*a* which illustrates a series of curves to demonstrate the operation of the embodiment of FIG. 1. The curve A of FIG. 1*a* is shown to be a ramp voltage which decreases with time. The ramp voltage shown in curve A of FIG. 1*a* appears at the position marked A in FIG. 1. In addition, other portions of the system of FIG. 1 are marked with letters which correspond to the same letters used to distinguish the curves of FIG. 1*a*.

The ramp voltage shown in curve A is applied to the voltage comparators 10 and 12, and when the voltage at both input terminals of the individual voltage comparators are equal the output voltage from the voltage comparator 10 steps up to produce an output pulse voltage. This can be seen in curve B of FIG. 1*a* when the voltage steps up when the value of the ramp voltage equals or is lower than the value of the voltage applied to terminal 14. As the ramp voltage continues to decrease, a second output pulse voltage is produced from the voltage comparator 12 when the ramp voltage decreases to the value of the voltage applied to terminal 16. The voltage applied to terminal 16 is at some constant value, either at ground potential or some other constant value. The output from voltage comparator 12 may be seen in curve C of FIG. 1*a*.

It can be seen that the output pulse voltages from voltage comparators 10 and 12 as shown in the curves B and C have a particular time relationship which is in accordance with the difference between the voltages on the terminals 16 and 14. Since the ramp voltage has a constant slope and the voltage applied to terminal 16 is constant, the time relationship between the outputs from the voltage comparators 10 and 12 is dependent upon the amplitude of the analog voltage applied to the terminal 14.

The output signal from the voltage comparator 10 is passed through a capacitor 22 which acts as a high pass filter to produce a trigger signal as shown in curve D of FIG. 1*a*. Also, the output signal from the voltage comparator 12 is passed through a capacitor 24 to produce a second trigger signal as shown in curve E of FIG. 1*a*. As can be seen, the trigger signals have the same time relationship as the pulse signal shown in curves B and C of FIG. 1*a*. The trigger signals are applied to the set and reset terminals of a flip-flop 26.

The flip-flop 26 has two states and the trigger signal shown in curve D of FIG. 1*a* sets the flip-flop 26 from the first to the second state and the trigger signal shown in curve E of FIG. 1*a* resets the flip-flop from the second state to the first state. The resultant output signal from the flip-flop is shown in curve F of FIG. 1*a* and is an output pulse signal which has a pulse width in accordance with the time relationship between the output pulse signals from the voltage comparators 10 and 12. The time relationship between the outputs from the voltage comparators 10 and 12 is in accordance with the amplitude of the analog signal as explained above.

Figure 2:
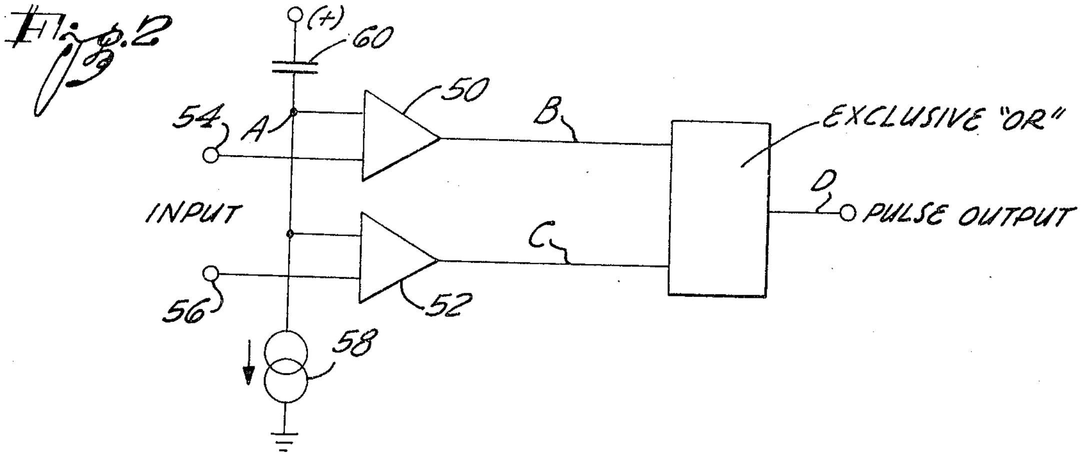

In FIG. 2, a similar pulse width conversion circuit is shown to that of FIG. 1. In FIG. 2, a pair of voltage comparators 50 and 52 receive inputs from input teminals 54 and 56. The input to input terminal 54 is an analog input signal and the input to input terminal 56 is a reference such as a reference potential such as ground or a constant voltage. In addition, voltage comparators 50 and 52 receive a ramp voltage produced by a constant current source 58 which discharges a capacitor 60. The outputs from the voltage comparators 50 and 52 are applied to an exclusive OR circuit 62 to produce the pulse width outpout signal from the exclusive OR circuit.

Figure 2A:
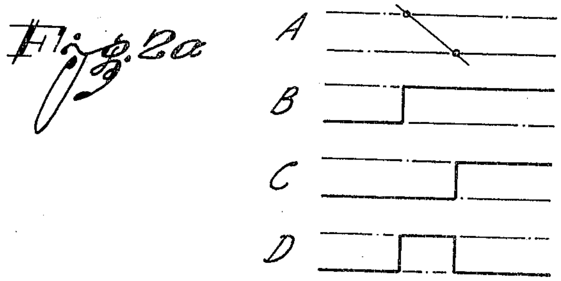

FIG. 2*a* is a series of curves showing the operation of the pulse width converter of FIG. 2. In FIG. 2*a*, the ramp voltage is shown in curve A and the position at which the ramp voltage shown in curve A of FIG. 2*a* appears in the circuit of FIG. 2 is illustrated by the reference character A shown in FIG. 2. The outputs from the voltage comparators 50 and 52 are shown by the curves B and C of FIG. 2*a*. Up to this point, the embodiment of FIG. 2 is similar to that shown in FIG. 1. In FIG. 1, however, the output signals from the voltage comparators are used to produce trigger signals so as to control a flip-flop. In the embodiment of FIG. 2 the output signals from the voltage comparators are used to directly produce the pulse width output signal.

The pulse width output signal is produced by applying the output signals from the voltage comparators 50 and 52 to exclusive OR circuit 62. The exclusive OR circuit produces an output only when the inputs to the exclusive OR circuit are dissimilar. In other words, when the input from voltage comparator 50 is of a first state and the input from voltage comparator 52 is of a second different state, then the exclusive OR circuit signal 62 produces an output. This is shown in curve D of FIG. 2*a* when the voltage comparator 50 initially produces an output pulse as shown in curve B of FIG. 2*a*. The output from the exclusive OR circuit 62 continues until the voltage comparator 52 also produces an output pulse as shown in curve C of FIG. 2*a*. When the voltage comparator 52 produces an output pulse, then the inputs to the exclusive OR circuit 62 are no longer dissimilar. When the inputs to the exclusive OR circuit 62 are similar the output from the exclusive OR circuit drops to zero and the voltage pulse signal shown in curve D of FIG. 2*a* is produced.

As can be seen in FIG. 2*a*, the voltage plus D has a time duration in accordance with the time relationship between the voltage pulses of curves B and C of FIG. 2*a*. Also, the time relationship between the voltage pulses of curves B and C of FIG. 2*a* is in accordance with the amplitude of the analog input signal applied to terminal 54. The embodiment of FIG. 2 is simpler than the embodiment of FIG. 1 since it eliminates the use of the capacitors 22 and 24 of FIG. 1, to provide trigger pulses, and, in addition, the exclusive OR circuit 62 is generally of a simpler construction than the flip-flop 26. However, the embodiment of FIG. 2 is limited in use since the rise time of the pulse output shown in curve D of FIG. 1 is in accordance with the rise time of the voltage comparator 50 and the rise time of voltage comparators is generally not as rapid as the rise time of flip-flops. The embodiment of FIG. 2, therefore, has its output pulse signal dependent upon the characteristics of the voltage comparators 50 and 52 wherein the output pulse signal from the flip-flop 26 of FIG. 1 is not dependent upon the characteristics of the voltage comparators 10 and 12.

Figure 3:
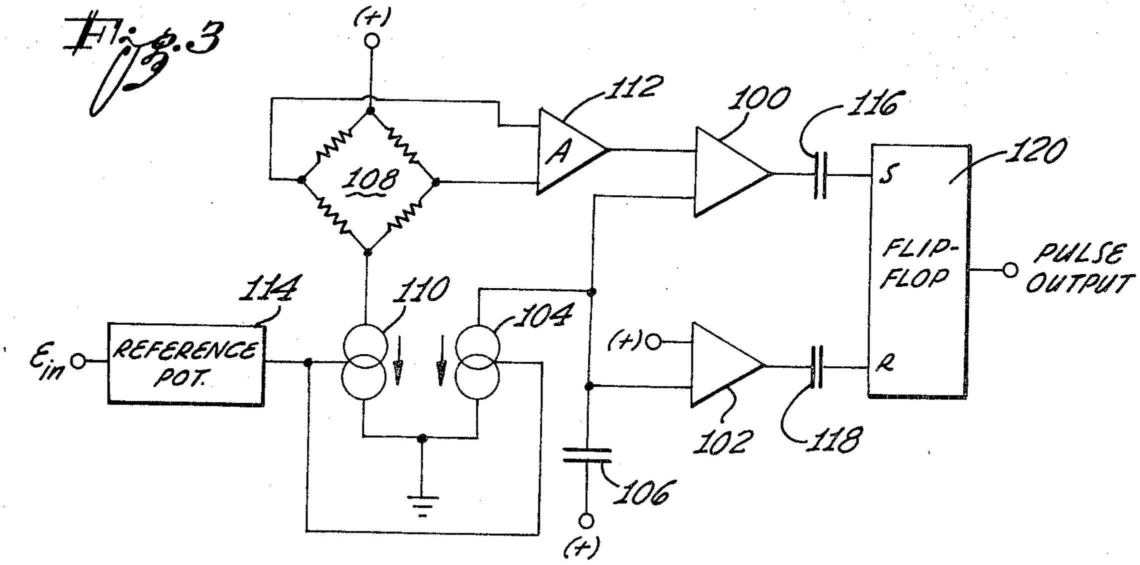
FIG. 3 illustrates an analog to pulse width converting system wherein the analog signal and the pulse width signal are both derived through the use of constant current generators driven from a common reference voltage.

In FIG. 3, a more detailed embodiment of the invention is shown illustrating the use of the pulse width converter of FIG. 1 with an analog input generator. It is to be appreciated that the pulse width converter of FIG. 2 may be used in place of the pulse width converter of FIG. 1 in the embodiment of FIG. 3. In FIG. 3, a pair of voltage comparators 100 and 102 receive input signals. For example, a constant current generator 104 and a capacitor 106 produce a ramp voltage which is applied as a first input to each of the voltage comparators 100 and 102. In addition, an analog input signal is produced from a bridge 108 which includes at plurality of resistors. One of the resistors such as resistor 109 represents a transducer which is a variable impedance device which responds to a physical phenomenon such as temperature, pressure, etc.

The bridge 108 is connected between a reference potential such as ground and a constant current generator 110. The constant current generator 110 produces a current through the bridge and the analog output signal across the bridge is in accordance with the change in impedance of the transducer element 109 included in the bridge 108. The output from the bridge 108 is applied to an amplifier 112 which produces a single-ended output to be applied as a second input to the comparator 100. The comparator 102 has as its second input a reference potential. It is to be appreciated that the output from the bridge is a differential signal and may be applied directly or through a differential amplifier to comparators 100 and 102 as the second inputs.

The constant current sources 104 and 110 are both driven from the same reference potential 114. Both constant current sources 104 and 110 would vary in accordance with any variation in the reference potential 114. Even though the reference potential 114 may vary, the ratio of the constant currents would be constant. It is easier to design a pair of constant current sources which maintain a substantially constant ratio than it is to provide for a constant current source which in itself maintains a perfectly constant current. The analog voltage produced from the bridge 108 is a direct function of the current from the constant current source 110. The analog voltage is then applied to a comparator 100 through the amplifier 112, and the analog voltage applied to the comparator 100 is compared to a set of parameters which are proportional to the current from the constant current source 104. Therefore, if the ratio between the two currents is held constant then the output from the voltage comparators is dependent upon the value of the capacitor 106. Since it is relatively simple to provide a capacitor of constant value, the pulse output signal has a pulse width which is in accordance with the amplitude of the analog signal.

The output pulse signal from the comparators 100 and 102 are similar to the curves B and C of FIGS. 1*a* and 2*a*. The output pulse signals are then applied to a pair of capacitors 116 and 118 to produce trigger signals similar to those shown in curves D and E of FIG. 1*a*. The trigger signals then control the flip-flop 120 to produce an output pulse signal similar to that shown in curve F of FIG. 1*a*. The output signal from the flip-flop 120 has a pulse width in accordance with the amplitude of the analog signal. It is to be appreciated that the voltage comparators 100 and 102 may be used to drive an exclusive OR circuit such as shown in FIG. 2.

Figure 4:
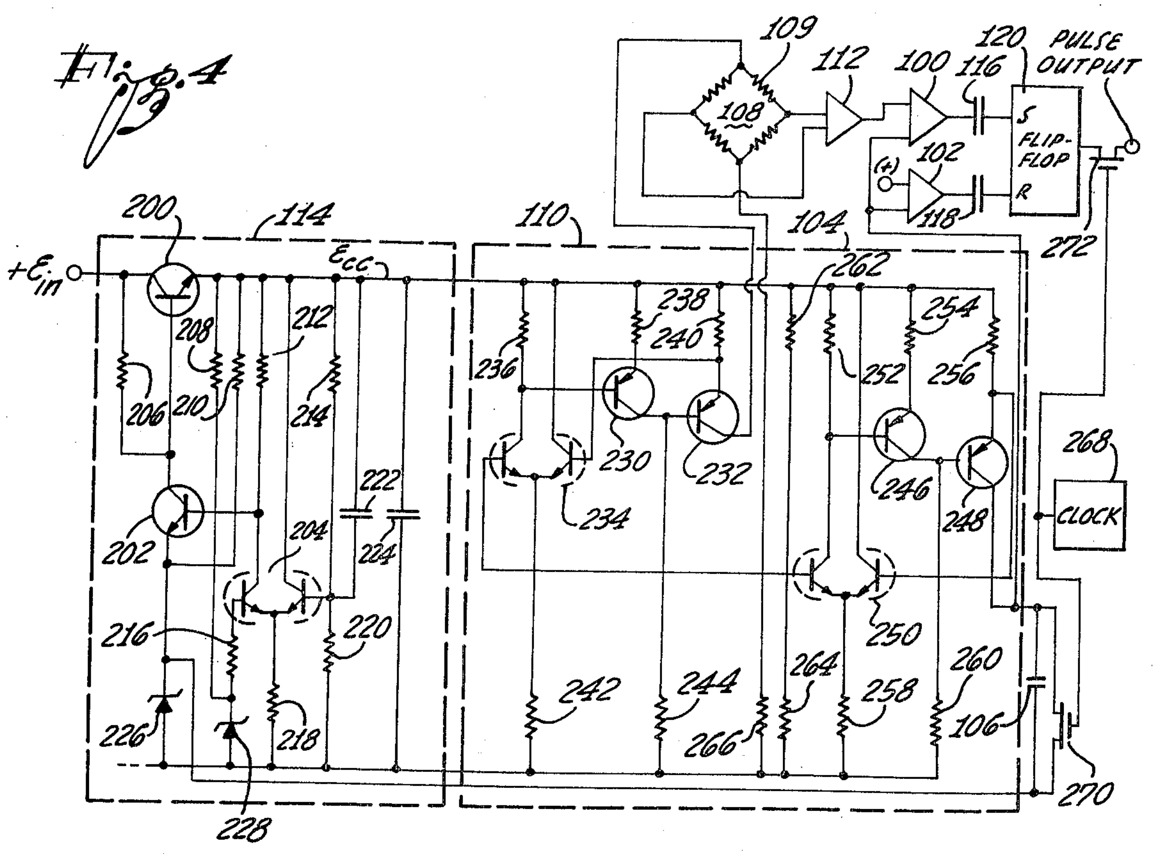
FIG. 4 is a detailed drawing, partially in block form and partially in schematic form, of an analog to pulse width converting system of the type shown in FIG. 3, but illustrating the interconnection of the constant current generators and the voltage reference in greater detail.

FIG. 4 illustrates a more detailed description of the embodiment of FIG. 3 showing in schematic form the source of reference potential 114, the constant current generator 110 and the constant current generator 104. FIG. 4 also includes the use of a clock to control the output from the pulse width conversion circuit. In FIG. 4, a pair of voltage comparators 100 and 102 are fed respectively from an analog signal derived from a bridge circuit 108 and coupled through an amplifier 112. In addition, a ramp signal is applied to the voltage comparators 100 and 102 and the ramp signal is partially derived through the use of the capacitor 106. The outputs from the voltage comparators 100 and 102 are coupled through the capacitors 116 and 118 to the flip-flop 120. It is to be appreciated, as indicated above, that the output from the voltage comparators 100 and 102 may be coupled directly to an exclusive OR circuit such as shown in FIG. 2.

In FIG. 4, a particular embodiment of the source of reference potential 114, the constant current generator 110 and the constant current generator 104 are shown in greater detail. The source of reference potential 114 uses an input voltage $E_{in}$ to produce a positive reference voltage $E_{cc}$. The source of reference potential 114 is essentially a voltage regulator and includes a pair of single transistors 200 and 202 and a dual transistor 204. In addition, the source of reference potential 114 includes resistors 206, 208, 210, 212, 214, 216, 218 and 220 to provide the proper biasing and loading for the transistors 200, 202 and 204. The source of reference potential 114 also includes a pair of capacitors 222 and 224. Finally, a pair of Zener diodes 226 and 228 add to the regulation of the voltage signal. The output signal designated as $E_{cc}$ is, therefore, regulated at a constant value and is applied to control the output currents from the constant current sources 104 and 110.

The current regulator 110 which is used in conjunction with the bridge 108 includes a pair of single transistors 230 and 232 and a dual transistor 234. In addition, resistors 236, 238, 240, 242, and 244 are used to provide proper biasing and loading of the transistors 230, 232 and 234.

The constant current source which is used in conjunction with the capacitor 106 to provide the ramp signal includes a pair of single transistors 246 and 248 and a dual transistor 250. Resistors 252, 254, 256, 258 and 260 are used to provide the proper biasing and load of the transistors 246, 248 and 250. Resistors 262 and 264 are used to provide biasing for both constant current sources 104 and 110. In addition, resistor 266 is used to couple the bridge 108 to the reference potential such as ground.

As can be seen in FIG. 4, both constant current sources 104 and 110 are controlled by the voltage from the source of reference potential 114. Therefore, any variations in the voltage from the source of reference potential 114 cause corresponding variations in the constant current sources 104 and 110 thereby maintaining a constant ratio between the constant current sources. It is to be appreciated that the constant current sources 104 and 110 may be replaced by a single constant current source which drives both the bridge 108 and the capacitor 106 when a single value of constant current is sufficient. In this way, any variation in the single constant current source is reflected equally in the output from the bridge 108 and the output from the voltage comparators 100 and 102. The currents through the bridge 108 and the capacitor are still in a constant ratio thereby providing for an output from the flip-flop 120 which varies only with changes in the amplitude from the analog signal from the bridge 108.

The embodiment of FIG. 4 also shows the use of a clock 268 which drives a pair of switches 270 and 272. The clock is designed to provide a repetitive nature for the ramp signal from the capacitor 106 by periodically shorting out the capacitor 106 through the use of the switch 270. At the same time, the output from the flip-flop 120 is controlled by the switch 272 so that the output from the flip-flop 120 is only allowed to pass at particular times in accordance with the operation of the clock 268. For example, when the capacitor 106 is being discharged by the switch 270, it is not desirable to pass the output from the flip-flop 120. Therefore, when the switch 270 is closed, the switch 272 is open. After the capacitor 106 has been reset by the switch 270 and the switch 270 is now open, then the switch 272 is closed, thereby passing on the output from the flip-flop 120.

Figure 5:
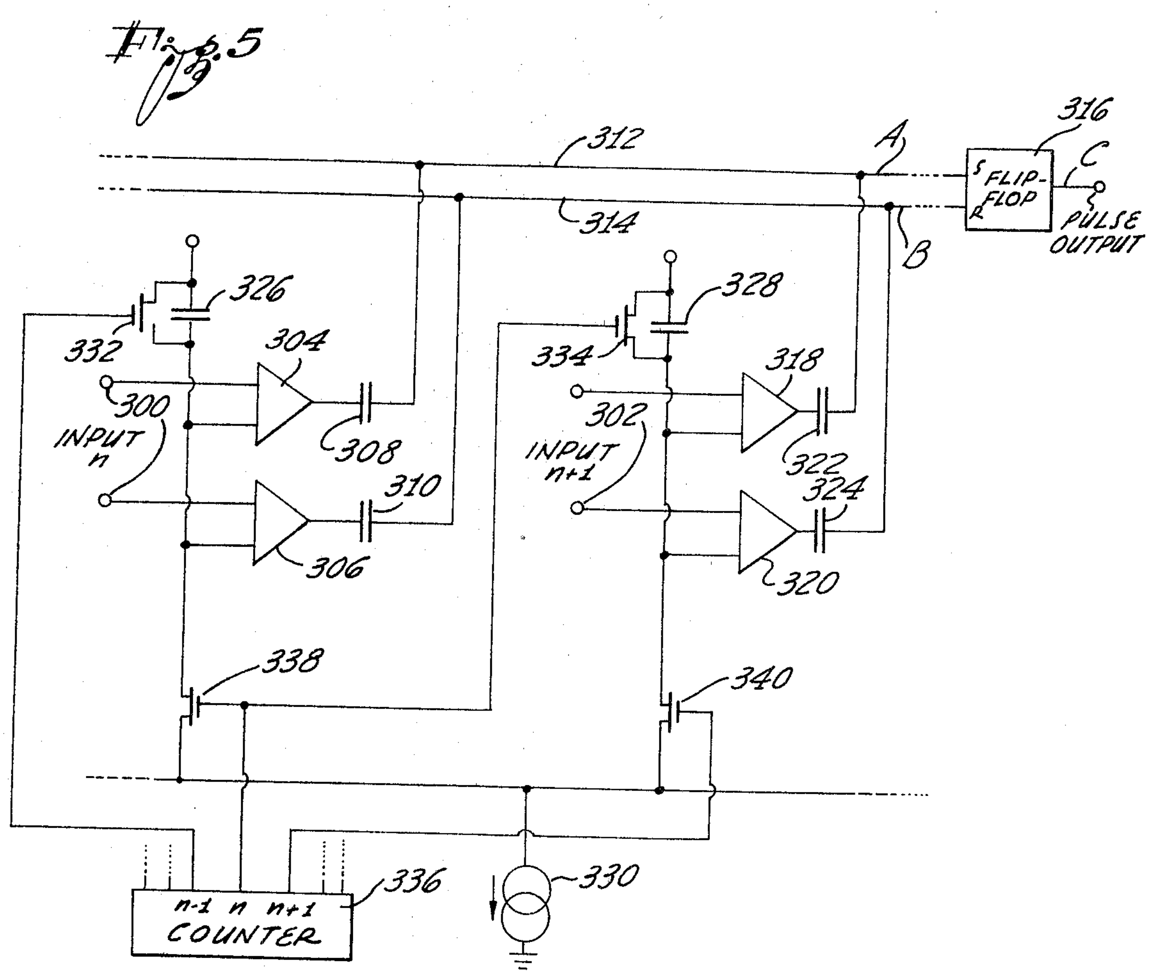
FIG. 5 illustrates an anlog to pulse width converting system with a plurality of parallel analog signals producing a serial pulse width output signal and using conversion systems similar to those shown in FIGS. 1 through 4.

FIG. 5 illustrates a system for producing a serial pulse width output signal from a plurality of parallel input signals. The input signals are shown at positions 300 and 302, and it is to be appreciated that a plurality of such signals may be used. The input signals also may be derived from bridge circuits as shown in FIG. 4 and when such bridge circuits are used, the bridge circuits may be driven by constant current generators which are referenced to the same reference potential as the constant current generator used in FIG. 5. In FIG. 5, voltage comparators 304 and 306 pass their output signals through capacitors 308 and 310 to a pair of control lines 312 and 314. The control line 312 is connected to the set terminal of a flip-flop 316 and the control line 314 is attached to the reset terminal of the flip-flop 316. A second set of voltage comparators 318 and 320 pass their output pulse signals through capacitors 322 and 324 to the control lines 312 and 314. It is to be appreciated that a plurality of such pairs of voltage comparators or a single capacitor may be used.

The voltage comparators are driven by the input signals 300 and 302 and, in addition, the voltage comparators are driven by ramp signals. The ramp signals are produced by capacitors 326 and 328 which are alternatively coupled to a constant current source 330. The capacitors 326 and 328 are reset periodically by switches 332 and 334. The switches 332 and 334 are controlled by a counter 336. The counter 336 also controls switches 338 and 340 which are used to connect the capacitors 326 and 328 to the constant current source 330. Again, it is to be appreciated that a plurality of such switches may be used as shown by the additional outputs from the counter 336.

In the operation of the system of FIG. 5, the voltage comparators produce output signals similar to that shown in curves B and C of FIG. 1*a*. Trigger signals are produced by the capacitors to control the operation of the flip-flop 316. The trigger signals may be seen in curves A and B of FIG. 5*a* and the trigger signals appear at the control lines 312 and 314 as marked by the reference characters A and B in FIG. 5. The output pulse signal from the flip-flop 316 is shown in curve C of FIG. 5*a* and the output pulse signal is a plurality of pulses each having a width in accordance with the time relationship between the trigger signals shown in curves A and B of FIG. 5*a*. It is to be appreciated that the trigger signals are in accordance with the outputs from the voltage comparators which are directly related to the amplitude of the analog input signals.

In the operation of the system of FIG. 5, the capacitor 326 is reset for operation at a time $n-1$ and is charged to a negative potential by the constant current source 330 when the counter 336 controls the switch 338 to be closed at the time $n$. Also, at the time $n$ the capacitor 328 is discharged in preparation for the charging of the capacitor by the constant current source 330. As the capacitor 326 is discharging so as to provide the ramp signal, comparators 304 and 306 provide output signals in accordance with the amplitude of the analog signal 300. This in turn controls the output from the flip-flop 316 as shown in curve C of FIG. 5*a*.

The counter 336 then switches to the time $n+1$ which controls the operation of the switch 340. The capacitor 328 which was previously discharged in time $n$ by the switch 334 is then charged to a negative potential by the operation of the constant current source 330 through the switch 340. This produces output signals from the comparators 318 and 320 in accordance with the amplitude of the analog signal 302, and such output signals from the voltage comparators are used to control the operation of the flip-flop 216.

Figure 5A:
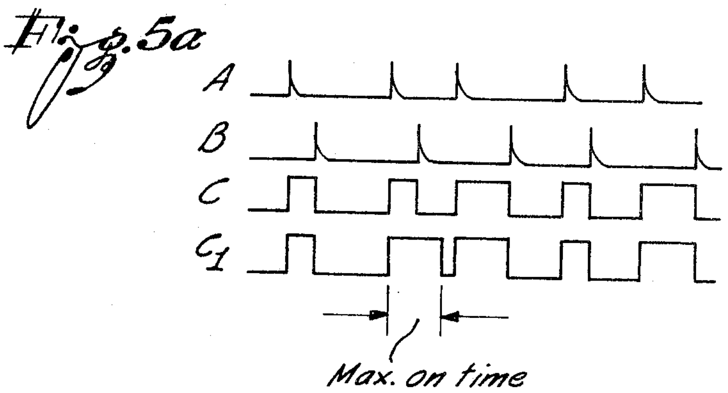
FIG. 5*a* is a series of curves illustrating the operation of FIG. 5.

The embodiment of FIG. 5 has an additional safeguard in that if any of the reset trigger signals are missing, the output signal from the flip-flop 316 is self-regulating. The self regulating is accomplished by providing that the flip-flop 316 may maintain the set state for a maximum period of time. For example, when the second trigger pulse shown in curve B of FIG. 5*a* is missing, the output from the flip-flop 316 is as shown in curve $C_1$ of FIG. 5*a*. As can be seen in curve $C_1$ of FIG. 5*a* the second curve appears for a period of time which is equal to the maximum ON time which may be provided by the flip-flop 316. This maximum ON time is indicated by the notation "Maximum ON time for the second pulse in curve $C_1$." After the maximum ON time the flip-flop automatically resets to its initial state to await the appearance of a set pulse to again initiate the operation of the flip-flop 316. It is to be appreciated that the absence of a set pulse produces no change in the output signal from the flip-flop 316. Only when the reset trigger pulse is missing does the flip-flop automatically reset.

The present invention provides for a conversion of an analog signal to a pulse width signal by a system which is simple and reliable. The pulse width signal is a direct representation of the amplitude of the analog signal, since the present invention uses energy sources which are maintained in a constant ratio. In addition, the pulse width conversion circuit of the present invention may be used to provide a serial pulse width output signal from a plurality of parallel input signals and with a low current drain. This can be seen in FIG. 5 wherein a single constant current source 330 is used to drive all of the ramp generators. Therefore, the constant current source 330 serves as a multiple ramp generator and it is not necessary to provide an additional constant current source for each capacitor.

The present invention has been shown with reference to particular embodiments illustrated in the drawings, but it is to be appreciated that various adaptations and modifications may be made. The invention is, therefore, only to be limited by the appended claims.

I claim:

1. In a system for converting an analog signal to a pulse signal and with the duration of the pulses in the pulse signal in accordance with the amplitude of the analog signal, a reference source of energy, first means electrically coupled to the reference source of energy for producing a first constant current, a variable impedance transducer electrically coupled to the first means and responsive to the first constant current for producing an analog signal and with the amplitude of the analog signal varying in accordance with variations in the impedance of the transducer, second means electrically coupled to the reference source of energy for producing a second constant current having a constant ratio with the first constant current, and third means operatively coupled to the second means and responsive to the analog signal and the second constant current for producing a pulse signal and with the duration of the pulse in accordance with the amplitude of the analog signal and wherein the third means for producing the pulse signal includes a ramp generator coupled to the second constant current for generating a ramp signal, a pair of comparators responsive to the ramp signal and the analog signal for comparing the ramp signal and the analog signal to produce a pair of pulse signals, and an exclusive "OR" circuit responsive to the pair of pulse signals.

2. In a system for converting an analog signal to a pulse signal having a pulse duration in accordance with the amplitude of the analog signal, a reference source of energy, first means electrically coupled to the reference source of energy for producing a first constant current, a variable impedance transducer electrically coupled to the first means and responsive to the first constant current for producing an analog signal and with the amplitude of the analog signal varying in accordance with variations in the impedance of the transducer, second means electrically coupled to the reference source of energy for producing a second constant current having a constant ratio with the first constant current, a ramp generator electrically coupled to the second constant current for producing a ramp signal, a pair of amplitude comparators responsive to the analog signal and the ramp signal for producing output signals from the amplitude comparators having a time relationship in accordance with the amplitude of the input signal, and means responsive to the output signals from the amplitude comparators for producing a pulse signal having a pulse duration in accordance with the time relationship between the output signals from the amplitude comparators.

3. The system of claim 2 wherein the last mentioned means includes a flip-flop having two states and wherein the output signals are trigger signals to control the state of the flip-flop.

4. The system of claim 2 wherein the last mentioned means includes an exclusive "OR" circuit and wherein the output signals are pulse signals.

5. In a system for converting a plurality of parallel input signals having variations in amplitude to a serial pulse signal having variations in pulse width in accordance with the amplitude of input signals, a source of constant energy, a plurality of variable impedance transducers electrically coupled to the source of constant energy for producing a plurality of parallel input signals having variations in amplitude in accordance with the variations in impedance of the variable impedance transducers, and first means electrically coupled to the source of constant enery for producing a serial pulse signal and with the first means responsive to the input signals for varying the pulse width of the pulses in the serial pulse signal in accordance with the amplitude of the input signals and wherein the first means includes a plurality of ramp generators for generating a plurality of ramp signals and wherein a plurality of pairs of comparators is responsive to one of the input signals and one of the ramp signals for producing output signals from each pair of the comparators having a time relationship in accordance with the amplitude of the input signal and wherein the first means additionally includes means responsive to the output signals for producing the serial pulse signal having pulses with pulse widths in accordance with the time relationship of the output signals.

6. In a system for converting a plurality of parallel input signals having variations in amplitude to a serial pulse signal having variations in pulse width in accordance with the amplitude of the input signals, a plurality of variable impedance transducers for producing a plurality of parallel input signals having variations in amplitude in accordance with the variations in impedance of the variable impedance transducers, a source of constant energy, switching means coupled to the source of constant energy, a plurality of conversion circuits electrically coupled to the switching means and with each conversion circuit responsive to a particular one of the parallel input signals and with the switching means alternatively coupling the source of constant energy to each of the conversion circuits to produce output signals from each of the conversion circuits having a time relationship in accordance with the amplitude of the corresponding parallel input signal, and means coupled to the plurality of conversion circuits and responsive to the output signals for producing a serial pulse signal having individual pulse widths in accordance with the time relationship of the output signals.

7. The system of claim 6 wherein the plurality of conversion circuits each includes a ramp generator for generating a ramp signal and a pair of comparators responsive to the ramp signal and one of the parallel input signals.

8. The system of claim 6 wherein the last mentioned means is a flip-flop having two states and wherein the output signals are trigger signals for controlling the state of the flip-flop.

9. The system of claim 6 wherein the last mentioned means is an exclusive "OR" circuit and wherein the output signals are pulse signals.

References Cited

UNITED STATES PATENTS

| | | | |
|---|---|---|---|
| 2,994,825 | 8/1961 | Anderson | 332—9 X |
| 3,053,996 | 9/1962 | Stefanov | 307—265 X |
| 3,390,354 | 6/1968 | Munch | 332—9 |
| 3,384,759 | 5/1968 | Aspell et al. | 307—216 |

DONALD D. FORRER, Primary Examiner

S. D. MILLER, Assistant Examiner

U.S. Cl. X.R.

307—228, 235; 328—116, 135, 146, 150; 332—9